United States Patent
Swart

(12) United States Patent (10) Patent No.: US 6,366,107 B2
(45) Date of Patent: *Apr. 2, 2002

(54) LOADING MECHANISM FOR AUTOMATED VERIFICATION AND REPAIR STATION

(75) Inventor: Mark A. Swart, Anaheim Hills, CA (US)

(73) Assignee: Delaware Capital Formation, Inc., Wilmington, DE (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/207,741

(22) Filed: Dec. 8, 1998

Related U.S. Application Data

(60) Provisional application No. 60/083,372, filed on Apr. 28, 1998.

(51) Int. Cl.[7] ............................................... G01R 31/02
(52) U.S. Cl. ........................................ 324/761; 324/755
(58) Field of Search ................................ 324/754, 755, 324/758, 761, 72.5, 757, 765

(56) References Cited

U.S. PATENT DOCUMENTS

| 4,108,528 A | * | 8/1978 | Long et al. ................... 439/42 |
| 4,138,188 A | * | 2/1979 | Long et al. ................. 324/754 |
| 4,746,857 A | * | 5/1988 | Sakai et al. ................ 324/765 |
| 5,003,254 A | * | 3/1991 | Hunt et al. ................. 324/754 |
| 5,270,641 A | * | 12/1993 | Van Loan et al. .......... 324/757 |
| 5,321,453 A | * | 6/1994 | Mori et al. ................. 324/754 |
| 5,461,323 A | * | 10/1995 | Yanagi et al. ............... 324/754 |

* cited by examiner

Primary Examiner—Ernest Karlsen
Assistant Examiner—Minh N. Tang
(74) Attorney, Agent, or Firm—Christie, Parker & Hale, LLP

(57) ABSTRACT

A flying prober having at least one prober head for contacting test sites on a unit under test which is programed for measuring isolations and continuities of test sites through the prober head. The flying prober includes an automatic loading and locating mechanism for securing the unit under test on the prober relative to the prober head and includes an angled frame for supporting the prober heads and the loading and locating mechanism.

15 Claims, 2 Drawing Sheets

LOADING MECHANISM FOR AUTOMATED VERIFICATION AND REPAIR STATION

CROSS REFERENCE TO RELATED APPLICATIONS

This application claims priority from U.S. Provisional Application No. 60/083,372 filed Apr. 28, 1998.

FIELD OF THE INVENTION

This invention relates to the automatic testing of bare printed circuit boards, and more particularly, to an automatic loading and locating mechanism for a fault verification and repair station.

BACKGROUND OF THE INVENTION

Traditional manual bare circuit board fault verification has been a tedious process. Most of the associated equipment merely provided a visual aid in the fault verification process. Typically a flying prober would be utilized for this purpose which traditionally was used to test prototype circuit boards providing the benefit that a test fixture did not have to be devised for the prototype circuit board. Using a flying prober provided the benefit of making it easier to test fine pitch test sites on the circuit boards. A problem with flying probers is that they are slow in testing the circuit board due to the requirement for manually contacting each required test site on the circuit board, which in contrast to a fixture which can test all the test sites on the circuit board simultaneously.

Traditional repair stations have also been used for fault verification for bare circuit boards. Traditional repair stations are graphics based having software which illustrates the circuitry to indicate where the possible failure could be. The repair station utilizes the failure data from the tester and verifies the failure data by hand placement of probers. Software used in connection with traditional repair stations provides risk areas for areas such as shorts or opens based upon the physical layout of the circuitry and the likelihood of leads in close proximity to each other. Conventional repair stations simply helped an operator locate a failed net end point designated by the tester, but stopped short of helping verify the fault and tracking down the location of the actual defect.

Flying probers have also been used as repair stations to verify error data from a tester. Typically there are two kinds of flying probers, namely, vertical probers and horizontal probers. In a vertical flying prober, the circuit board to be tested stands vertically upright and a probe contacts the board from either side depending upon the test site locations. The board is manually loaded and held in an upright position by hand manipulated clamps which are moved to the appropriate position and tightened to secure the circuit board. A disadvantage with vertical flying probers is that it is time consuming to manually move each clamp into position and manually manipulate the clamp to secure the circuit board. In the horizontal flying prober, the circuit boards are manually loaded into a drawer which is pulled out from the frame structure of the prober. Clamps hold the board to secure the circuit boards in a horizontal position. Again, the disadvantage in a horizontal flying prober is the time consuming and labor intensive procedure of manually loading boards in the drawer for testing. Consequently, Consequently, a need exists for a flying prober verification and repair station with an improved loading and locating mechanism which quickly and accurately loads the printed circuit boards into the prober for testing.

SUMMARY OF THE INVENTION

The present invention is a automated bare board fault verification and repair station having a locating and loading mechanism which automatically secures the circuit board to be tested or unit under test (UUT) in position. The fault verification and repair station of the present invention will also be referred to as a flying prober. The flying prober of the present invention includes, preferably, two X-Y-Z prober heads positioned on one side of the unit under test which move independently across the surface of the circuit board to contact the desired test locations on the circuit board. Although two prober heads are preferred, more or less can be used, and on one or both sides of the UUT. The flying prober further includes electronic hardware and software for measuring isolations and continuities of the test sites electrically connected to the prober heads. The prober further includes a loading and locating mechanism for automatically securing the unit under test on the prober relative to the prober heads.

The loading and locating mechanism includes an upper housing and a lower housing one each positionable at opposite ends of the circuit boards. The housings include a lower lip for resting the edges of the circuit board on the housing. The lower housing is fixed on the frame of the flying prober and the upper housing is adjustable by screw clamps to accommodate different sized circuit boards. Positioned inside each of the upper housing and the lower housing is a movable clamping block having a plurality of finger springs rotatable by a dowel rod to lift and lower the springs above the upper surface of the circuit board. An air cylinder on either end of the clamping blocks moves the clamping block forward and backward. Similarly, an air cylinder, or other suitable actuator rotates the dowel rod to raise and lower the finger springs.

In operation, the upper housing is manually set to the desired positioned according to the specific size of the circuit board to be tested by securing the screw clamps to the frame. The circuit board to be tested is then positioned on the housing such that the edges of the circuit board rest on the lip of the upper and lower housing. Because the frame is angled, gravity allows the circuit board to be located on the clamping mechanism. With the finger springs in a raised position, the clamping blocks are actuated forward towards the circuit board to position the ends of the finger springs over the edge of the circuit board. The dowel rod is then actuated to lower the finger springs into contact with the upper surface of the circuit board along the edge to securely clamp the circuit board in the flying prober. The prober heads are then actuated across the surface of the circuit board to conduct the fault verification process. The dowel rod, clamping block and prober heads are automatically operated and controlled by the software programed within the flying prober.

DETAILED DESCRIPTION

Figure 1:
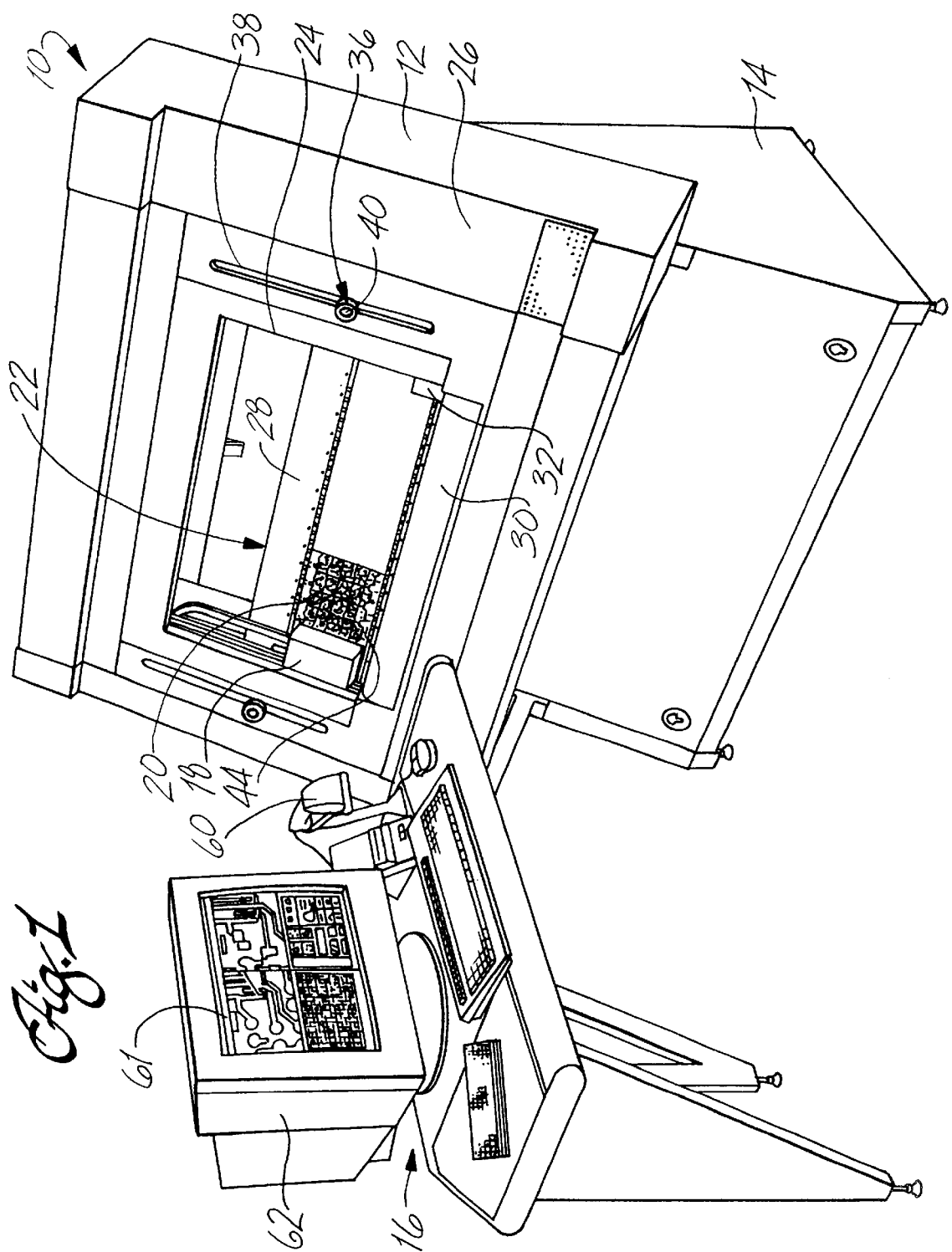
FIG. 1 is a perspective view of the flying prober of the present invention.

FIG. 1 illustrates the automated bare board fault verification and repair station, and hereinafter referred to as a flying prober 10 of the present invention. The flying prober includes an angled frame 12 supported upon a base 14 and an input station 16 positioned adjacent the angled frame 12. The angled frame includes at least one prober head 18, and preferably two prober heads for movement across the surface of a bare printed circuit board or unit under test 20. The unit under test is positioned within the angled frame by an automated locating and loading mechanism 22 positioned within an opening 24 in the face 26 of the angled frame 12.

Figure 2:
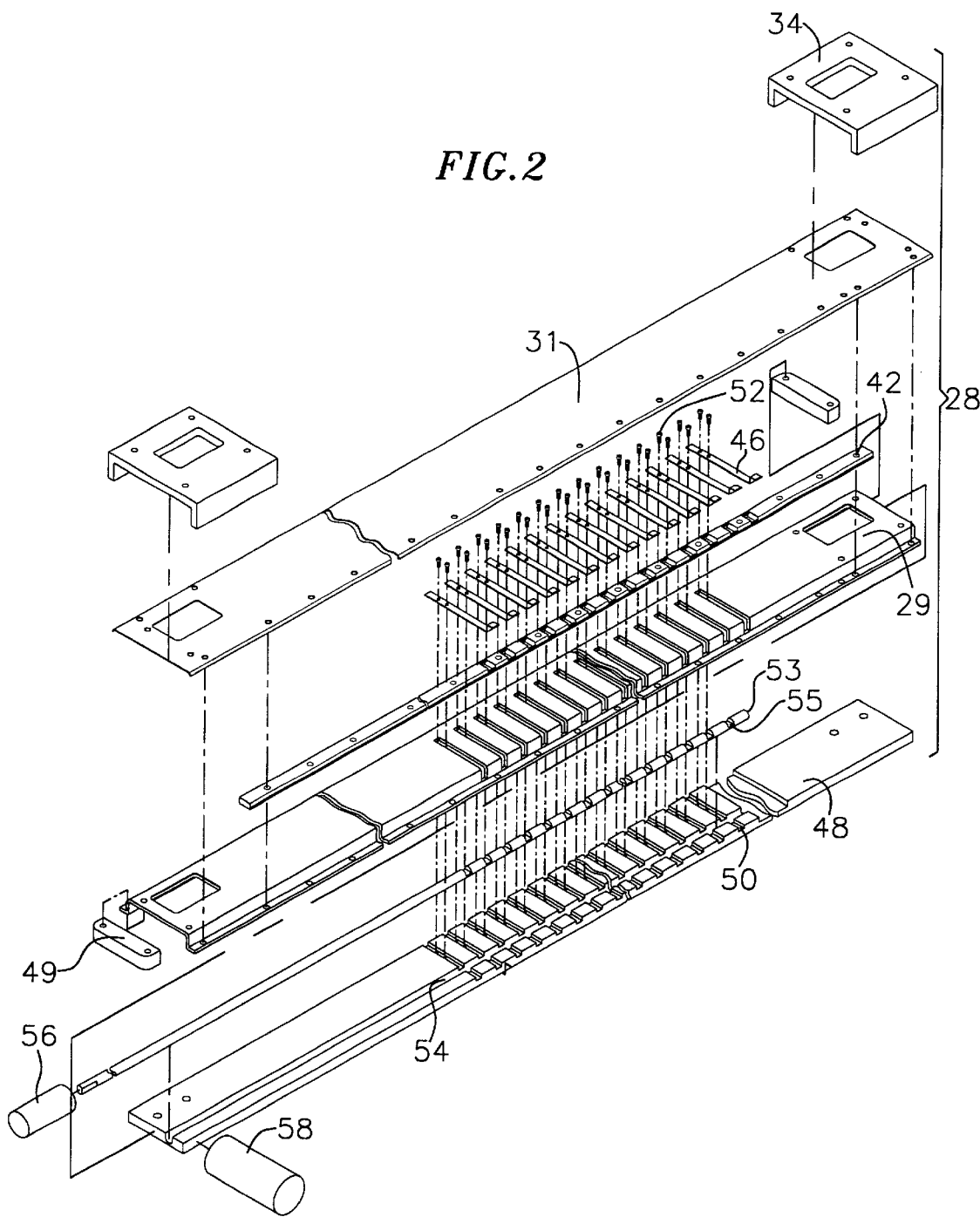
FIG. 2 is an exploded assembly view of the locating and loading mechanism of the flying prober of FIG. 1.

As also seen in FIG. 2, the automated loading and locating mechanism 22 includes an upper housing 28 and a lower housing 30. The upper and lower housings are positioned within the opening in the angled frame at a distance away from each other corresponding to the width of the unit under test 20. Lower housing 30 is rigidly positioned in the angled frame by mounting blocks 32 positioned on either end of the housing. The upper housing 28 includes a body portion 29 and a cover 31 which are moveable to accommodate varying width circuit boards to be tested by having mounting blocks 34 positioned on either end of the upper housing which are connected to a screw clamp 36 adjustable within vertical slots 38 in the face 26 of the angled frame. Screw clamps 36 are adjusted by rotation of knobs 40 to loosen and tighten the screw clamp along the desired location of the vertical slot. Both the upper and lower housing have a lip 42 extending along the surface adjacent to the unit under test. The lips 42 can be integrally formed within the upper or lower housing or can be a separate component fastened to the housing by screws, rivets, etc. The lips form a surface for receipt of the unit under test.

Considering the loading and locating mechanism 22 is positioned within the angled frame, the mechanism is also in an angled position thereby allowing gravity to initially hold the unit under test between the upper and lower housing on the lips. The unit under test is simply placed by hand between the upper and lower housing against a stop 44 located on the left hand side of the housing which is the prober location for registration by the prober heads.

The unit under test is held in position between the upper and lower housing by a plurality of finger springs 46 extending from both the upper and lower housing and are positioned along the length of a clamping block 48 positioned within the upper and lower housing. The clamping block 48 is secured within body portion 29 by blocks 49 located on either end of the body portion. The finger springs are positioned along the length of a clamping block wherein each finger spring is positioned within a groove 50 corresponding to the width of each finger spring. Preferably the finger springs 46 are secure to the clamping block by screws 52. The finger springs extend beyond the edge of the clamping blocks. The fingers springs are raised and lowered by a dowel rod 53 positioned within a groove 54 extending along the length of the clamping block. The dowel rod has a plurality of notches 55 corresponding to the width of the finger springs. The finger springs are lowered to their unit under test engaging position by rotating the dowel rod so that the notches in the dowel rod are adjacent the finger springs. The finger springs are raised by rotating the dowel rod thereby moving the notches in the dowel rod away from the finger springs so that the non-notched portion of the dowel rod lifts the finger springs upperwardly and away from the unit under test. The dowel rod is rotated by a liner actuator 56, such as an air cylinder.

The clamping block is moved toward and away from the unit under test also by a liner actuator 58, such as an air cylinder. The liner actuators for the dowel rod and the clamping block are attached to the upper and lower housing.

When the unit under test is loaded into the upper and lower housing the clamping block is in its retracted position and the finger springs are in their raised position. The clamping blocks are then moved forward positioning the bent end of the finger springs over the edge of the unit under test. The dowel rod is then actuated to lower the bent ends of the finger springs on to the upper surface of unit under test thereby securely clamping the unit under test on the lips of the upper and lower housing.

The fault verification is then preformed by moving the prober heads over the surface of the unit under test to make contact with the desired test locates on the unit under test.

As seen in FIG. 1, first an operator scans a bar code on an error tag generated from a tester for a particular unit under test. A bar code scanner 60 is located on the input station 16. The fault file 61 is instantly imported to the computer screen 62. Next, the unit under test is loaded into the locating and loading mechanism 22. The unit under test is slipped into the preset position which eliminates the need for board specific tooling hardware. The prober heads automatically move to the exact location of the first reported fault and make a precise resistance measurement on the pair of failed nodes. When the end points are verified, the reported fault is identified as either false or real. Once the fault has been verified a real-time high-resolution video camera magnifies the image of high risk locations. The actual area of the circuit board is viewable on the computer screen for a visual inspection as to whether a defect exists.

What is claimed is:

1. A flying prober comprising:
    at least one prober head for movement across a surface of a unit under test during testing to successively contact test sites on the unit under test;
    means for measuring isolations and continuities of test sites electrically connected to the prober head;
    a loading and locating mechanism including an upper and lower housing each having a clamping block and movable finger springs positioned within grooves along a surface of the clamping block for automatically clamping the unit under test on the flying prober in a stationary position relative to the prober head by applying pressure to an upper surface of the unit under test; and
    an angled frame for supporting the prober head, unit under test and loading and locating mechanism.

2. A flying prober of claim 1 wherein there are at least two prober heads moving independently across a surface of the unit under test.

3. The flying prober of claim 1 wherein the clamping block includes a dowel rod adapted to raise and lower the finger springs.

4. The flying prober of claim 3 wherein the dowel rod includes a plurality of notches for receipt of the finger springs.

5. The flying prober of claim 4 further including a linear actuator for extension and retraction of the clamping block within the upper and lower housing.

6. The flying prober of claim 4 further including a linear actuator to rotate the dowel rods.

7. The flying prober of claim 6 further having clamping means for adjustably positioning the location of the upper housing relative to the lower housing.

8. A flying prober comprising:

a frame; and means located on the frame including an upper and lower housing each having a clamping block and movable finger springs positioned within grooves along a surface of the clamping block for automatically clamping a circuit board to be tested in the frame by applying pressure to an upper surface of the circuit board.

9. The flying prober of claim 8 wherein the frame is inclined.

10. The flying prober of claim 8 wherein there are at least two prober heads moving independently across a surface of the circuit board to be tested.

11. The flying prober of claim 8 wherein the clamping block includes a dowel rod adapted to raise and lower the finger springs.

12. The flying prober of claim 11 wherein the dowel rod includes a plurality of notches for receipt of the finger springs.

13. The flying prober of claim 12 further including a linear actuator for extension and retraction of the clamping block within the upper and lower housing.

14. The flying prober of claim 12 further including a linear actuator to rotate the dowel rods.

15. The flying prober of claim 14 further having clamping means for adjustably positioning the location of the upper housing relative to the lower housing.

* * * * *

UNITED STATES PATENT AND TRADEMARK OFFICE
CERTIFICATE OF CORRECTION

PATENT NO. : 6,366,107 B2 Page 1 of 1
DATED : April 2, 2002
INVENTOR(S) : Mark A. Swart It is certified that error appears in the above-identified patent and that said Letters Patent is hereby corrected as shown below:

Title page,
Item [56], References Cited, U.S. PATENT DOCUMENTS, replace
"4,138,188 A   * 2/1979     Long et al....324/754" with
-- 4,138,186 A   * 2/1979     Long et al......324/754 --.

Column 1,
Line 63, after "for testing" delete "Consequently".

Column 4,
Line 67, change "rods" to -- rod --.

Column 6,
Line 12, change "rods" to -- rod --.

Signed and Sealed this

Eighteenth Day of February, 2003

JAMES E. ROGAN
*Director of the United States Patent and Trademark Office*